(12) United States Patent
Kim et al.

(10) Patent No.: US 8,366,008 B2
(45) Date of Patent: Feb. 5, 2013

(54) RADIO FREQUENCY IDENTIFICATION TAG, AND METHOD OF MANUFACTURING THE SAME

(75) Inventors: Woon Chun Kim, Gyunggi-do (KR); Hyun Seop Shim, Incheon (KR); Woon Bong Joh, Gyunggi-do (KR); Jae Suk Sung, Gyunggi-do (KR); Soon Gyu Yim, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 392 days.

(21) Appl. No.: 12/688,985

(22) Filed: Jan. 18, 2010

(65) Prior Publication Data

US 2011/0042466 A1    Feb. 24, 2011

(30) Foreign Application Priority Data

Aug. 19, 2009  (KR) ................ 10-2009-0076877

(51) Int. Cl.
*G06K 19/07*  (2006.01)
(52) U.S. Cl. ...................................................... 235/492
(58) Field of Classification Search ............... 235/492, 235/487, 792; 340/572.1
See application file for complete search history.

(56) References Cited

U.S. PATENT DOCUMENTS

| | | | |
|---|---|---|---|
| 6,404,339 B1 * | 6/2002 | Eberhardt ................... | 340/572.1 |
| 6,459,588 B1 * | 10/2002 | Morizumi et al. ............ | 361/737 |
| 7,152,804 B1 * | 12/2006 | MacKenzie et al. .......... | 235/492 |
| 7,833,839 B1 * | 11/2010 | Touzelbaev et al. .......... | 438/122 |

FOREIGN PATENT DOCUMENTS

| KR | 1020080014609 A | 2/2008 |
|---|---|---|
| KR | 100831403 B1 | 3/2008 |

OTHER PUBLICATIONS

Korean Office Action for patent application No. 10-2009-0076877, issued Jan. 7, 2011.
Chinese Office Action for Application No. 201010004752.7 mailed Jul. 3, 2012.

* cited by examiner

*Primary Examiner* — Seung Lee
(74) *Attorney, Agent, or Firm* — Lowe Hauptman Ham & Berner, LLP

(57) ABSTRACT

There is provided a radio frequency identification (RFID) tag. The RFID tag includes a base formed of an insulating material, a circuit chip adhered to one surface of the base and including a pad for an electrical connection, and an antenna formed by jetting a conductive material onto the one surface of the base and electrically connected to the pad.

9 Claims, 3 Drawing Sheets

RADIO FREQUENCY IDENTIFICATION TAG, AND METHOD OF MANUFACTURING THE SAME

CROSS-REFERENCE TO RELATED APPLICATIONS

This application claims the priority of Korean Patent Application No. 10-2009-0076877 filed on Aug. 19, 2009, in the Korean Intellectual Property Office, the disclosure of which is incorporated herein by reference.

BACKGROUND OF THE INVENTION

1. Field of the Invention

The present invention relates to a radio frequency identification tag and a method of manufacturing the same, and more particularly, to a radio frequency identification tag that is readable in a non-contact state, and a method of manufacturing the same.

2. Description of the Related Art

A radio frequency identification tag (hereinafter, 'RFID tag') is readable in a non-contact state, unlike a barcode or the like, which can be read only in a contact state.

According to the use of power sources, there are active RFID tags provided with power sources, and passive RFID tags having no power sources. Also, RFID tags are classified as either a low-frequency system or a high-frequency system, according to the utilized frequency band.

A passive RFID tag includes a dielectric member having a plate shape, an antenna disposed on the dielectric member, and an integrated circuit (IC) chip placed on the surface of the dielectric member.

The antenna of the passive RFID tag receives a radio signal of electromagnetic waves input from a reader, thereby creating induced current in an electric circuit. Due to this current, information stored in the IC chip is converted into electromagnetic waves, and is then transmitted to the reader through the antenna.

The reader reads the signal from the RFID tag to thereby identify the information stored in the RFID tag. Typically, such RFID tags are built in or attached to products related to stored information.

In producing the RFID tag, the process of electrically connecting the IC chip to the antenna on the dielectric member is performed separately.

However, in that case, the connected part between the antenna and the IC chip may be undesirably detached, impairing the reliability of contact. Therefore, techniques for solving such a limitation are required.

SUMMARY OF THE INVENTION

An aspect of the present invention provides an RFID tag capable of shortening the manufacturing process thereof and enhancing the reliability of the connection between an antenna and a circuit chip, and a method of manufacturing the same.

According to an aspect of the present invention, there is provided a radio frequency identification (RFID) tag, including: a base formed of an insulating material; a circuit chip adhered to one surface of the base and including a pad for an electrical connection; and an antenna formed by jetting a conductive material onto the one surface of the base and electrically connected to the pad.

The antenna may be disposed along aside surface of the circuit chip in close contact with the circuit chip.

The pad may protrude to the outside of the circuit chip.

The RFID tag may further include a protector disposed on the base and protecting the antenna and the circuit chip.

The protector may have a uniform thickness along the antenna and the circuit chip.

The RFID tag may further include a cover disposed on the base to cover the antenna and the circuit chip.

According to another aspect of the present invention, there is provided a method of manufacturing a radio frequency identification (RFID) tag, the method including: providing a base formed of an insulating material; adhering a circuit chip including a pad for an electrical connection to one surface of the base; and forming an antenna electrically connected to the circuit chip by jetting a conductive material onto the surface of the base.

The antenna may be formed on the surface of the base by an aerosol jet printing method.

The method may further include forming a protector on the base to protect the circuit chip and the antenna.

The method may further include forming a cover on the base to cover the antenna and the circuit chip.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

An RFID tag and a method of manufacturing an RFID tag will now be described in detail with reference to FIGS. 1 through 6.

Figure 1:
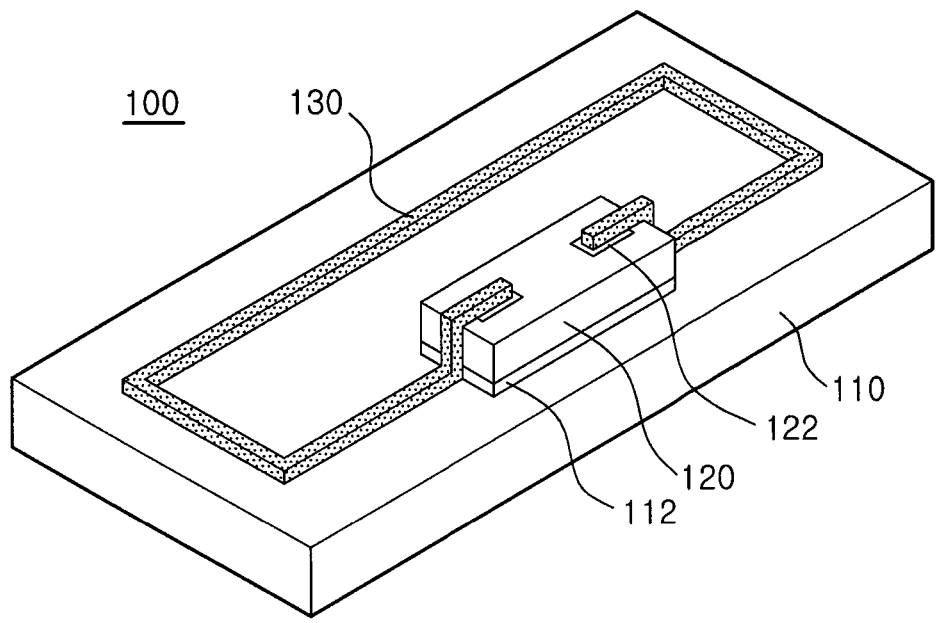
FIG. 1 is a schematic perspective view illustrating an RFID tag according to an exemplary embodiment of the present invention.
Figure 2:
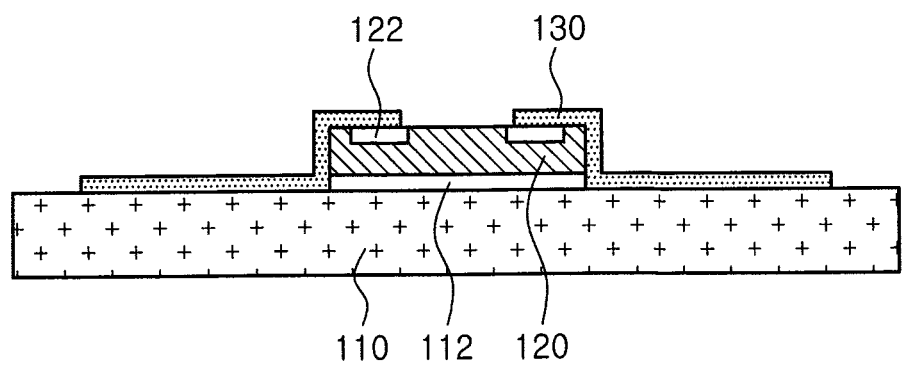
FIG. 2 is a cross-sectional view of the RFID tag of FIG. 1.
Figure 3:
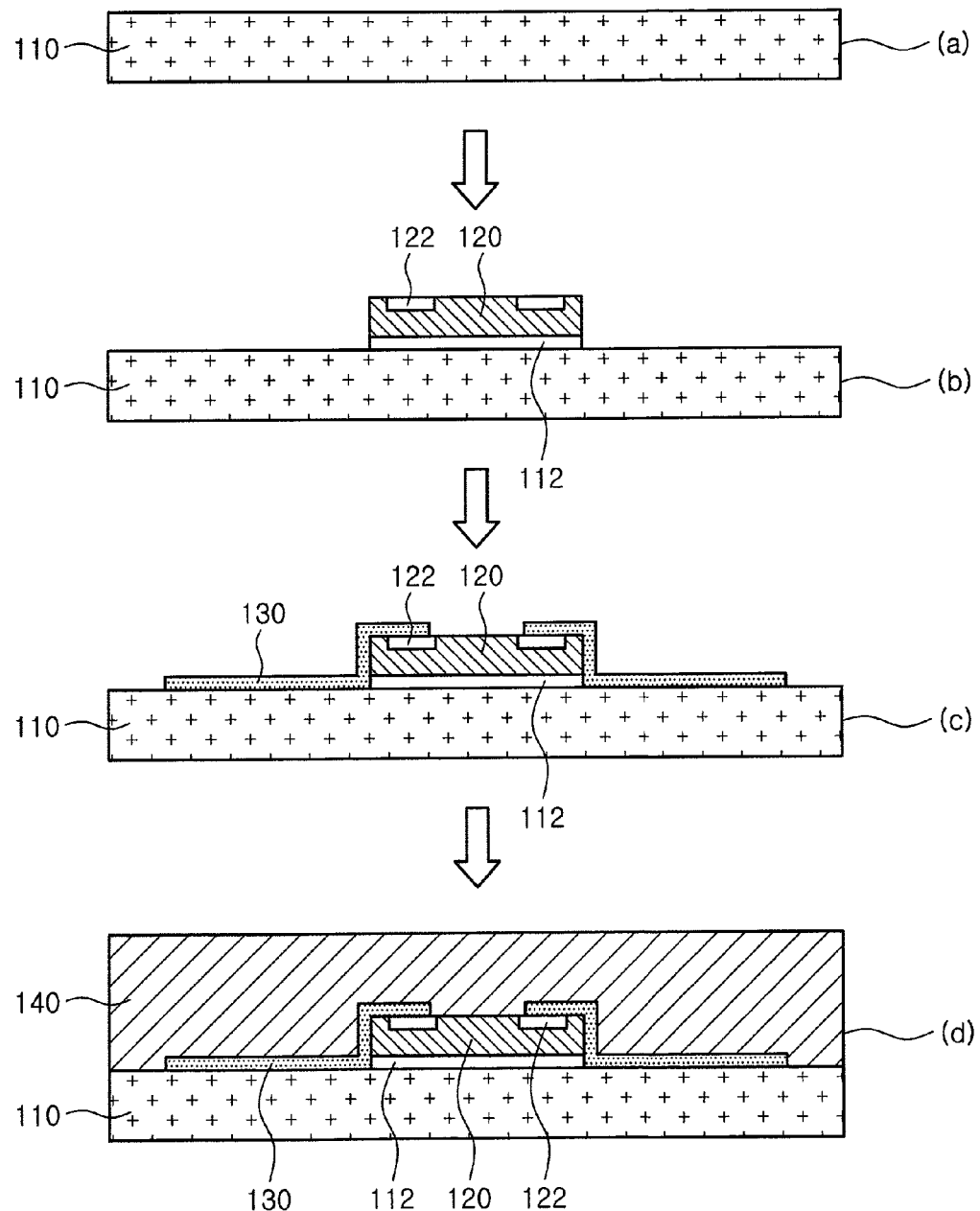
FIGS. 3A through 3D are perspective views for explaining a method of manufacturing an RFID tag according to an exemplary embodiment of the present invention.

FIG. 1 is a schematic perspective view illustrating an RFID tag according to an exemplary embodiment of the present invention, and FIG. 2 is a cross-sectional view of the RFID tag of FIG. 1.

Referring to FIGS. 1 and 2, an RFID tag 100 may include a base 110, a circuit chip 120 and an antenna 130.

The base 110 may be formed of an insulating material and have a hexagonal shape. The base 110 has a flat bottom surface, thereby facilitating its mounting on another electronic device.

The base 110 may have a curved shape to facilitate its application to a personal portable terminal or the like. Here, the personal portable terminal refers to any terminal with mobility, which is easy to carry, capable of data communications via mobile communications networks or satellite communications networks, and capable of receiving a variety of image information including still images or moving pictures. Examples of the terminal may include a portable terminal, a personal digital assistant (PDA) or the like.

In addition, the circuit chip 120 is adhered to the top surface of the base 110 by using an adhesive 112, and the adhesive 112 may utilize an anisotropic conductive film (ACF).

The circuit chip 120 may receive power through the electrically connected antenna 130 by radio. The circuit chip 120 is activated by the power received by radio, and thus receives/transmits radio signals with an external RFID reader via the antenna 130.

The circuit chip 120 processes reception/transmission signals into digital data. The circuit chip 120 recognizes a request of the reader on the basis of digital reception data from the reader, and outputs transmission data, desired information, according to the request of the reader. In the above-described way, the circuit chip 120 and the reader share information between each other.

Pads 122 are disposed on the surface of the circuit chip 120 opposite to the adhered surface between the circuit chip 120 and the base 110. That is, the pads 122 may face upward on the base 110.

The antenna 130 is placed on the surface of the base 110 in the form of a predetermined pattern. In this embodiment, the shape of the antenna 130 may have a quadrangular shape. Both ends of the antenna 130 contact the pads 122 of the circuit chip 120, respectively.

However, the shape of the antenna 130 is not limited to the description and illustration. The antenna 130 may be produced into a variety of pattern shapes according to a designer's intention.

Here, the antenna 130 has a predetermined frequency at which a radio signal can be transmitted/received between the antenna 130 and an external RFID reader.

The circuit chip 120, adhered to the surface of the base 110, has a thickness causing the antenna 130 to have a height difference, and a typical printing method fails to form such an antenna 130 on the circuit chip 120.

According to this embodiment, the antenna 130 may be formed by jetting a conductive material along the surfaces of the circuit chip 120 and the base 110. Here, the jetting of the conductive material may be performed using an aerosol jet printing method, but the present invention is not limited thereto.

The antenna 130 formed in the above-described manner is easily formed into a predetermined pattern shape on the surface of the base 110. The conductive material is jetted continuously along the side surfaces of the circuit chip 120, thereby forming the antenna 130 extending along the side surfaces of the circuit chip 120. Thus, the antenna 130 may have both ends contacting the top portions of the pads 122 of the circuit chip 120, respectively.

Since a single operation may produce the antenna 130 along the surfaces of the circuit chip 120 and the base 110, the process of separately producing the antenna 130 and electrically connecting the antenna 130 to the circuit chip 120 may be omitted, thereby shortening the manufacturing process. Also, the antenna 130 is connected to the circuit chip 120 with precision by using an aerosol jet printing method, thereby enhancing the reliability of an electrical connection.

FIGS. 3A through 3D are perspective views for explaining a method of manufacturing an RFID tag according to an exemplary embodiment of the present invention.

As shown in FIG. 3A, the method of manufacturing an RFID tag may include providing a base 110 formed of an insulating material.

As shown in FIG. 3B, a circuit chip 120 including a pad 122 for an electrical connection may be adhered to one surface of the base 110.

As mentioned above, an adhesive 112 for the above adhesion may utilize an anisotropic conductive film (ACF), but is not limited to the description.

After the circuit chip 120 is adhered to the one surface of the base 110, as shown in FIG. 3C, a conductive material may be jetted onto the surface of the base 110 so as to form an antenna 130 electrically connected to the circuit chip 120.

Accordingly, the antenna 130 connecting the pad 122 of the circuit chip 120 with the one surface of the base 110 can be simply formed. Here, the method of jetting a conductive material may utilize an aerosol jet printing method.

Thereafter, as shown in FIG. 3D, the base 110 may be disposed in a mold to thereby form a cover 140.

As described above, the RFID tag and the method of manufacturing the RFID tag according to this embodiment include the antenna 130 formed by jetting a conductive material onto the base 110 to be electrically connected with the circuit chip 120 capable of radio communications. Thus, there is no need to electrically connect the antenna with the circuit chip 120 using a separate process, thereby shortening the manufacturing process. This shortened manufacturing time may in turn lead to economical advantages.

Also, the RFID tag and the method of manufacturing the RFID tag according to the present invention enable both ends of the antenna 130 to contact the pads 122 on the circuit chip 120 with precision under the direct supervision of an operator, thereby further enhancing the reliability of an electrical connection.

Figure 4:
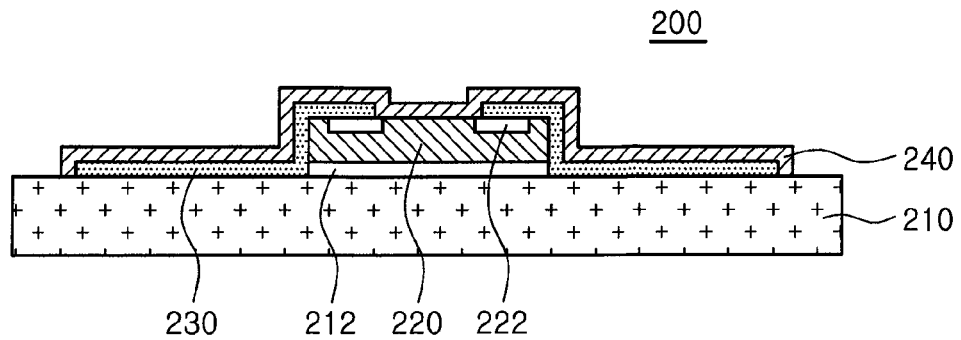
FIG. 4 is a cross-sectional view of an RFID tag according to another exemplary embodiment of the present invention.
Figure 5:
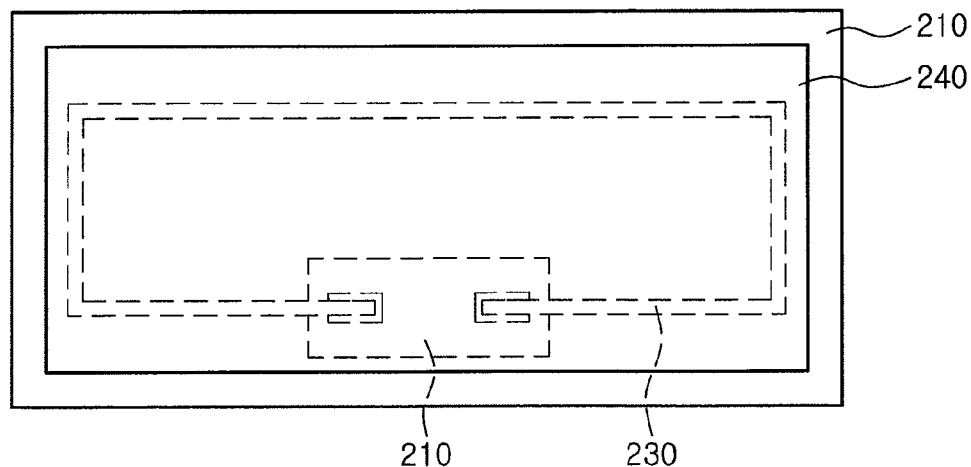
FIG. 5 is a plan view of the RFID tag of FIG. 4.

FIG. 4 is a cross-sectional view illustrating an RFID tag according to another exemplary embodiment of the present invention, and FIG. 5 is a plan view illustrating the RFID tag depicted in FIG. 4.

Referring to FIGS. 4 and 5, an RFID tag 200 may include a base 210, a circuit chip 220, an antenna 230 and a protector 240.

According to this embodiment, the base 210, the circuit chip 220, and the antenna 230 are substantially identical to those of the previous embodiment, and detailed descriptions thereof may be omitted.

The protector 240 may be disposed on the top surface of the base 210 to entirely cover the circuit chip 220 and the antenna 230. The protector 240 protects the antenna 230 and the circuit chip 220. Here, the protector 240 may have a uniform thickness along the antenna 230 and the circuit chip 220.

The material of the protector 240 may be formed of a polymer material having a damper function. However, the material of the protector 240 is not limited to the description, and may utilize a variety of materials such as a ferrite magnetic substance.

Accordingly, the RFID tag, according to this embodiment, primarily absorbs any impact from external environments with the protector 240, so that its internal structure can be protected.

Figure 6:
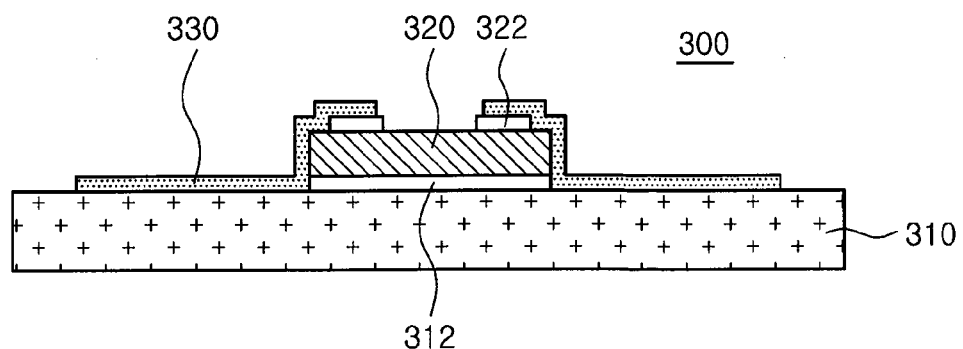
FIG. 6 is a cross-sectional view illustrating an RFID tag according to another exemplary embodiment of the present invention.

FIG. 6 is a cross-sectional view illustrating an RFID tag according to another exemplary embodiment of the present invention.

Referring to FIG. 6, an RFID tag 300 may include a base 310, a circuit chip 320 and an antenna 330.

In this embodiment, the base 310 and the antenna 330 are substantially identical to those of the previous embodiment, and detailed description thereof may be omitted. Although a protector or a cover is not illustrated in FIG. 6, those constructions may be added according to a designer's intention.

The circuit chip 320 may be disposed on one surface of the base 310 with its pad 322 protruding to the outside.

The antenna 330 is formed on the circuit chip 320 and the pad 322 to be electrically connected to the circuit chip 320 by using an aerosol jet printing method. This antenna 330 extends along the side surface of the circuit chip 320 and along the side surface of the pad 322. That is, the antenna 330 has a shape bent along the outer surfaces of the circuit chip 320 and the pad 322.

As set forth above, according to exemplary embodiments of the invention, the RFID tag and the method of manufacturing the RFID tag include the antenna formed by jetting a conductive material onto the base to be electrically connected to the circuit chip capable of radio communications. Accordingly, there is no need for the process of electrically connecting a separately produced antenna with the circuit chip, thereby shortening the manufacturing costs and achieving economical advantages.

In the RFID tag and the method of manufacturing the RFID tag, both ends of the antenna can contact the pads on the circuit chip with precision; thereby further enhancing the reliability of an electrical connection.

While the present invention has been shown and described in connection with the exemplary embodiments, it will be apparent to those skilled in the art that modifications and variations can be made without departing from the spirit and scope of the invention as defined by the appended claims.

What is claimed is:

1. A radio frequency identification (RFID) tag, comprising:
a base formed of an insulating material;
a circuit chip adhered to one surface of the base and including a pad for an electrical connection;
an antenna formed by jetting a conductive material onto the one surface of the base and electrically connected to the pad; and
a protector disposed on the base and protecting the antenna and the circuit chip, wherein
the protector is formed of a polymer material having a damper function,
the circuit chip has a top surface on which the pad is formed, a bottom surface adhered to the one surface of the base, and a side surface connecting the top surface and the bottom surface, and
the antenna is partially formed on the side surface of the circuit chip.

2. The RFID tag of claim 1, wherein the antenna is disposed along the side surface of the circuit chip in close contact with the circuit chip.

3. The RFID tag of claim 1, wherein the pad protrudes to the outside of the circuit chip.

4. The RFID tag of claim 1, wherein the protector has a uniform thickness along the antenna and the circuit chip.

5. The RFID tag of claim 1, further comprising a cover disposed on the base to cover the antenna and the circuit chip.

6. A method of manufacturing a radio frequency identification (RFID) tag, the method comprising:
providing a base formed of an insulating material;
adhering a circuit chip including a pad for an electrical connection to one surface of the base;
forming an antenna electrically connected to the circuit chip by jetting a conductive material onto the surface of the base; and
forming a protector on the base to protect the circuit chip and the antenna, wherein
the protector is formed of a polymer material having a damper function,
the circuit chip has a top surface on which the pad is formed, a bottom surface adhered to the one surface of the base, and a side surface connecting the top surface and the bottom surface, and
the antenna is partially formed on the side surface of the circuit chip.

7. The method of claim 6, wherein the antenna is formed on the surface of the base by an aerosol jet printing method.

8. The method of claim 6, further comprising forming a cover on the base to cover the antenna and the circuit chip.

9. The method of claim 6, wherein the protector has a uniform thickness along the antenna and the circuit chip.

* * * * *